United States Patent
Yamazaki

(10) Patent No.: US 7,538,408 B2
(45) Date of Patent: May 26, 2009

(54) INHIBITION OF PARASITIC TRANSISTOR OPERATION IN SEMICONDUCTOR DEVICE

(75) Inventor: Tomoyuki Yamazaki, Matsumoto (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 11/447,758

(22) Filed: Jun. 6, 2006

(65) Prior Publication Data

US 2007/0023782 A1    Feb. 1, 2007

(30) Foreign Application Priority Data

Jul. 28, 2005    (JP)    ............................. 2005-219606

(51) Int. Cl.
*H01L 29/00*    (2006.01)
(52) U.S. Cl. .................... 257/499; 257/500; 257/502
(58) Field of Classification Search ................ 257/499, 257/500, 502, 544
See application file for complete search history.

(56) References Cited

U.S. PATENT DOCUMENTS 6,642,583 B2    11/2003    Jimbo et al.

2001/0040266 A1 *  11/2001   Pozzoni et al. ............. 257/500

FOREIGN PATENT DOCUMENTS

| JP | 2000-236067 A | 8/2000 |
|---|---|---|
| JP | 2004-006555 A | 1/2004 |

* cited by examiner

*Primary Examiner*—Phat X Cao
(74) *Attorney, Agent, or Firm*—Rossi, Kimms & McDowell, LLP

(57) ABSTRACT

A semiconductor device includes a surface layer on the side of a first principal surface of a p-semiconductor substrate, a high side n-isolation-diffused region and a low side n-isolation-diffused region formed apart from each other by a distance that is shorter than the diffusion length of electrons in the p-semiconductor substrate. In a region between the high side n-isolation-diffused region and the low side n-isolation-diffused region, a p-region is formed which has a higher impurity concentration than the p-semiconductor substrate. A first electrode in contact with the p-region and a second electrode in contact with a second principal surface of the p-semiconductor substrate are brought to be at the ground potential. This, at switching of a low side IGBT, makes a charging or discharging current flowing from the high side n-isolation-diffused region flow toward the back surface of the substrate to be taken out from the second electrode.

3 Claims, 4 Drawing Sheets

INHIBITION OF PARASITIC TRANSISTOR OPERATION IN SEMICONDUCTOR DEVICE

BACKGROUND OF THE INVENTION

The present invention relates to a semiconductor device such as a high voltage driver IC used for controlling and driving a power device.

Big tasks for an electric conversion device, such as an inverter used in power switching devices, are power consumption reduction, function enhancement, downsizing, cost reduction or noise reduction. In the field of a power module having been commercialized by combining IGBTs (Insulated Gate Bipolar Transistors) and FWDs (Free Wheel diodes), demand for an IPM (Intelligent Power Module) is increasing year by year. The IPM is a module mounted with intelligent functions such as over current detection and protection or overheating detection and protection and incorporating in a power module a microcomputer for carrying out an operation programming of an inverter and components of an interface with an IGBT (the components of the intelligent functions). Thus, an effort to downsize an inverter is made by mounting the IPM.

In an IPM, however, there was a problem in that integration of detection circuits or protection circuits, which had been previously formed outside of a power module, into the power module increases the number of components thereby increasing the size of the IPM and causing costs to rise. For solving the problem, a high voltage driver IC (an HVIC (High Voltage Integrated Circuit) having a function of a driver) has made its appearance in which circuits with driver functions of an upper and lower arms, having their respective IGBTs, of a power conversion device, and circuits having various kinds of protecting functions are mounted in one silicon chip. The high voltage driver IC itself has a structure that can ensure a high voltage of 600V or 1200V as an element breakdown voltage of an IGBT.

FIG. 5 is a diagram showing connection of an HVIC and IGBTs. As shown in FIG. 5, an HVIC 1 has a control unit 11, a low side gate driver (GDUL) 12, a level-shifter 13 and a high side gate driver (GDUH) 14. A low side level on/off signal outputted from the control unit 11 is inputted to the gate of a low side IGBT 21 through the GDUL 12. The low side level on/off signal is also converted into a high side level on/off signal by the level-shifter 13. The high side level on/off signal is inputted to the gate of a high side IGBT 22 through the GDUH 14. In FIG. 5, reference numerals 23 and 24 denote FWDs.

FIG. 6 is a diagram showing a schematic configuration of the high voltage level-shifter 13. As shown in FIG. 6, the high voltage level-shifter 13 has a configuration in which a level-shift resistor 18 is connected in series to the drain of a high voltage n-channel MOSFET (HVN) 17 with a configuration in which pinch resistance 16 is connected to the drain of an n-channel MOSFET 15. In FIG. 6, VDD, GND, VCC and OUT designate a low side power supply potential, the ground potential, a high side power supply potential and a floating potential, respectively. Reference characters IN and GATE designate a low side level on/off signal and a high side level on/off signal, respectively. Moreover, reference numerals 19a to 19d denote inverters.

For a structure isolating a high voltage section and a low voltage section from each other in the high voltage driver IC, a general structure is given as a self-isolation structure or a junction isolation structure, a structure using a p-n junction, or a dielectric isolation structure using a dielectric material such as $SiO_2$. In the self-isolation structure, a p-substrate, for example, is used on the top surface of which an n-island region is formed in which a circuit such as a driver circuit formed by a CMOS is made incorporated. By providing an adequate voltage withstanding structure in the n-island region, the high voltage section and the low voltage section can be electrically isolated by p-n junction capacitance.

For the voltage withstanding structure, a RESURF (REduced SURface electric Field) structure is used for the purpose of reducing an electric field concentration at a p-n junction appeared on the surface of the substrate. When a reverse bias voltage is applied between the isolated n-region and the substrate, the depletion layer expands in parallel with the surface of the substrate at a parallel plate junction at the bottom of a planar junction. Compared with this, at an end section of the region, a depletion layer is generally hard to uniformly expand to make electric field liable to concentrate. Therefore, the impurity concentration of the n-region is determined lower to make the end section easily depleted. With the RESURF structure, electric field strength is made reduced, by which high voltage withstanding characteristics can be obtained.

FIG. 7 is a cross sectional view showing an example of a high side device structure. As shown in FIG. 7, in the top surface layer of a p-semiconductor substrate 31, an n-isolation-diffused region 32 of an n-well is selectively formed. The resistance component of the n-isolation-diffused region 32 becomes the above-explained pinch-resistor. In the top surface layer of the n-isolation-diffused region 32, a region with a lateral HVN 34 and a region with a lateral n-channel MOSFET (MVN) 35 and a p-channel MOSFET (MVP) 36 both used for forming circuits in the n-isolation-diffused region 32 are formed with a self-shielded interconnection 33 formed between the regions. On the outside of the n-isolation-diffused region 32 in the top surface layer of the p-semiconductor substrate 31, a $p^+$-region 37 is formed. The $p^+$-region 37 is normally made at the ground potential.

To the n-isolation-diffused region 32 having a voltage withstanding structure, a power supply voltage of a driving circuit of a high side IGBT is applied. Moreover, in the n-isolation-diffused region 32, a p-region is provided to which a reference voltage of the driving circuit is applied. The p-region is also connected to the emitter electrode of the high side IGBT. Therefore, at switching of the low side IGBT, violent fluctuation in the collector voltage of the low side IGBT causes accompanied abrupt variations dV/dt to appear in the emitter terminal of the high side IGBT. The variations dV/dt are applied to the HVIC with the magnitude thereof sometimes becoming up to on the order of 10 to 20 kV/μs.

When the junction capacitance between the n-isolation-diffused region 32 and the p-semiconductor substrate 31 is charged or discharged by the variation dV/dt, a displacement current flows. The displacement current, unless adequately treated, becomes a base current of a parasitic transistor with lateral elements formed in the n-isolation-diffused region 32 and possibly causes faulty operations of circuits or destruction of the element. As countermeasures against this, the following technologies by the inventors are made publicly known.

In a semiconductor device including a first region of a first conductivity type, a second region of a second conductivity type selectively formed in the surface layer of a first principal surface of the first region, a third region of the second conductivity type formed in the surface region layer of the second region and a fourth region of the first conductivity type selectively formed in the surface layer of the second region, the third region is arranged around the fourth region with the second region arranged between. Moreover, the semiconductor device is characterized in that the minimum distance (L: in units of μm) between the third regions positioned with the fourth region put between and the sheet resistance (Rs: in units of Ω/□) of the second region satisfy the relationship of L≦4400/Rs (see JP-A-2000-236067, for example). By thus selecting L and Rs, high dV/dt noise robustness against 40 kV/μs or more can be ensured.

In addition, like on the high side, an n-isolation-diffused region (see FIG. 3) is also formed on the low side. Thus, the displacement current also becomes the base current of a parasitic transistor formed by the high side n-isolation-diffused region 32, the p-semiconductor substrate 31 and the low side n-isolation-diffused region (see FIG. 3). Therefore, measures are necessary against faulty operations and destruction of circuits by the parasitic transistor operation. As a measure against this, there is a publicly known technology that will be explained in the following.

The semiconductor device according to the publicly known technology is characterized by including a semiconductor substrate of a first conductivity type, a semiconductor region of a second conductivity type on the semiconductor substrate, and a trench structure reaching the semiconductor substrate of the first conductivity type from the semiconductor region of the second conductivity type, the semiconductor region being separated by the trench structure into a first and second regions, at least one of the first and second regions having a first conductivity type MOS with its first conductivity type drain region and its first conductivity type source region formed in the one of the regions, and a first conductivity type region formed in the semiconductor region having a second conductivity type MOS with its second conductivity type drain region and its second conductivity type source region formed in the first conductivity type region (see, for example, JP-A-2004-6555 and U.S. Pat. No. 6,642,583). The trench structure thus formed can inhibit a parasitic transistor or a parasitic thyristor a parasitically formed in the semiconductor device from causing parasitic operation (a bipolar operation or latchup) by a switching operation of a large capacity power supply semiconductor such as an IGBT.

However, in each of the semiconductor devices disclosed in JP-A-2004-6555 and U.S. Pat. No. 6,642,583, although the trench structure is formed between the high side n-isolation diffused region and the low side isolation diffused region as a region for taking out a displacement current, there is a drawback in that the number of process steps for forming the trench structure increases thereby increasing the cost of the chip. Moreover, there is also another drawback in that, in order to secure a region in which the trench structure is formed for taking out a displacement current, the chip area increases which also results in an increase in expense of the chip.

In order to solve the problems about the above-explained problems, it would be desirable to provide a semiconductor device such as an HVIC having sufficient dV/dt robustness without causing an increase in cost.

SUMMARY OF THE INVENTION

The present invention provides a semiconductor device such as an HVIC having sufficient dV/dt robustness, while solving the above-explained problems. The semiconductor device according to a first aspect of the invention is characterized by including a semiconductor substrate of a first conductivity type, a first region of a second conductivity type selectively provided in the surface layer on the side of a first principal surface of the semiconductor substrate, a second region of a second conductivity type provided in the surface layer on the side of the first principal surface of the semiconductor substrate apart from the first region, a third region of the first conductivity type provided between the first region and the second region in the surface layer on the side of the first principal surface of the semiconductor substrate, the third region having an impurity concentration higher than the semiconductor substrate, a first electrode in contact with the third region, and a second electrode in contact with a second principal surface of the semiconductor substrate and brought to be at a potential equal to the potential of the first electrode.

According to the first aspect of the invention, abrupt variations dV/dt applied to the first region causes a current to flow by charging or discharging of the junction capacitance between the first region and the semiconductor substrate. Most of the current flows in the direction from the first region toward the second principal surface of the semiconductor substrate and flows into the second electrode. Therefore, an amount of a current flowing under the second region is small. This can prevent an operation of a parasitic n-p-n transistor formed with the first region, the semiconductor and the second region. Moreover, the region for taking out a displacement current from the first principal surface side has no trench structure. Thus, an increase in chip cost due to an increase in the number of process steps and an increase in chip area can be prevented.

The semiconductor device according to a second aspect of the invention is characterized in that, in the first aspect of the invention, the distance between the first region and the second region is shorter than the diffusion length of minority carriers in the semiconductor substrate. Moreover, the semiconductor device according to a third aspect of the invention is characterized in that, in the first aspect of the invention, the distance between the first region and the second region is shorter than 100 μm.

According to the second or third aspect of the invention, an area occupied by the region for taking out a displacement current from the first principal surface side of the semiconductor substrate becomes small. Therefore, an increase in chip cost due to an increase in chip area can be prevented.

Moreover, the semiconductor device according to a fourth aspect of the invention is characterized in that, in the invention according to any one of the first to the third aspects of the invention, a circuit is formed with a lateral semiconductor element in each of the first region and the second region.

The semiconductor device according to the invention is effective in that a semiconductor device such as an HVIC can be obtained which is provided with sufficient dV/dt robustness without causing an increase in cost.

BRIEF DESCRIPTION OF THE DRAWINGS

The invention will be described with reference to certain preferred embodiments and the accompanying drawings, where.

DESCRIPTION OF THE PREFERRED EMBODIMENT

A preferred embodiment of a semiconductor device according to the invention will now be explained in detail with reference to the attached drawings. In the following explanations and the attached drawings, a leading character "n" or "p" attached to names of layers and regions means that majority carriers in the layers and the regions are electrons or holes, respectively. Moreover, a sign "+" attached to the leading character "n" or "p" means that the layer and the region have an impurity concentration higher than those with names without the sign, and a sign "−" attached to the leading character "n" or "p" means that the layer and the region have an impurity concentration lower than those with names without the sign.

Figure 1:
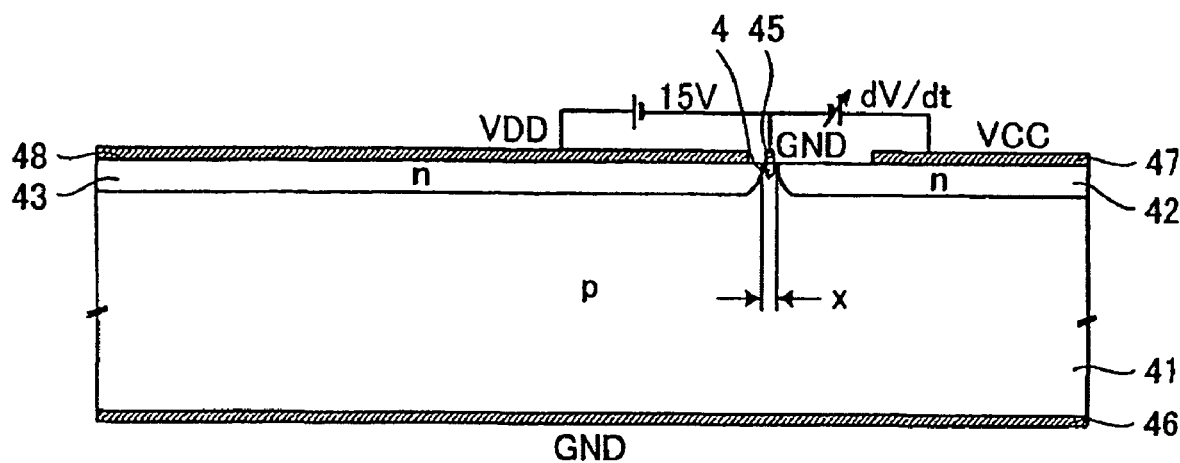
FIG. 1 is a cross sectional view showing an example of a principal part of a semiconductor device according to the invention.

FIG. 1 is a cross sectional view showing an example of a principal part of a semiconductor device according to the invention. The semiconductor device shown in FIG. 1 is an HVIC, which is formed by using a p-semiconductor substrate 41. In a surface layer on the side of a first principal surface (top surface) of the p-semiconductor substrate 41, a high side n-isolation-diffused region (n-well) 42 to be a first region and a low side n-isolation-diffused region (n-well) 43 to be a second region are selectively formed by a distance x apart from each other. The distance x is shorter than the diffusion length of electrons as minority carriers in the p-semiconductor substrate 41. For example, the distance x is shorter than 100 μm.

In a region between the high side n-isolation-diffused region 42 and the low side n-isolation-diffused region 43 in the surface layer on the side of the first principal surface of the p-semiconductor substrate 41, a p-region 44 is formed as a third region apart from the high side and low side n-isolation-diffused regions 42 and 43. The p-region has a higher impurity concentration than the p-semiconductor substrate 41. A first electrode 45 is formed in contact with the p-region 44.

A second electrode 46 is provided in contact with a second principal surface (back surface) of the p-semiconductor substrate 41. The first electrode 45 and the second electrode 46 are brought to ground potential. Namely, the substrate potential is fixed at the ground potential by both of the first electrode 45 and the second electrode 46. A third electrode 47 and fourth electrode 48 are respectively provided in contact with the high side n-isolation-diffused regions 42 and the low side n-isolation-diffused regions 43. The third electrode 47 is brought to be at a high side power supply potential VCC. The fourth electrode 47 is brought to be at a low side power supply potential VDD.

Figure 6:
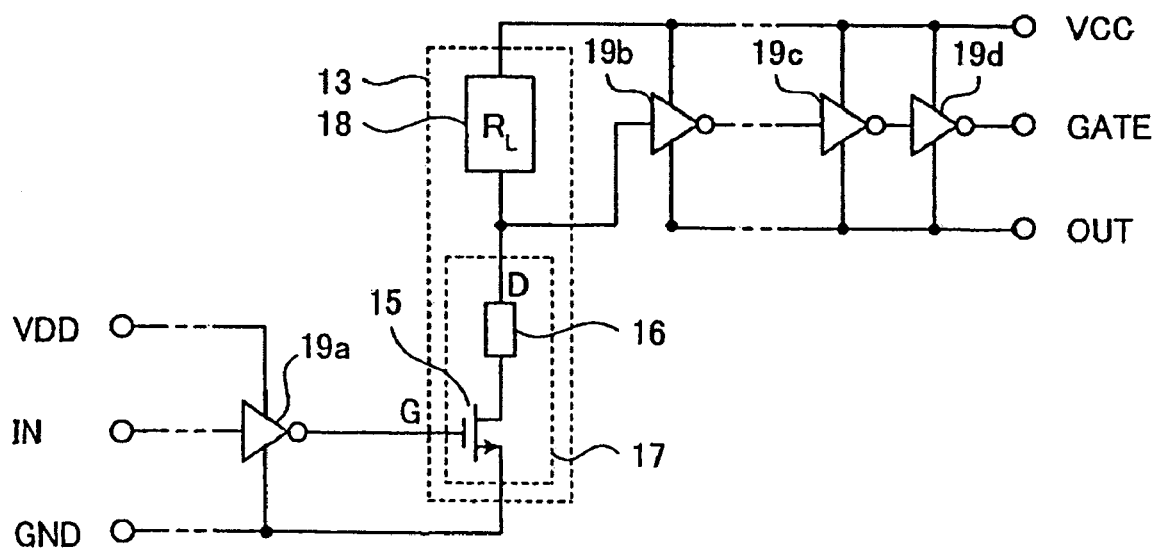
FIG. 6 is a diagram showing a schematic configuration of a high voltage level-shifter.
Figure 7:
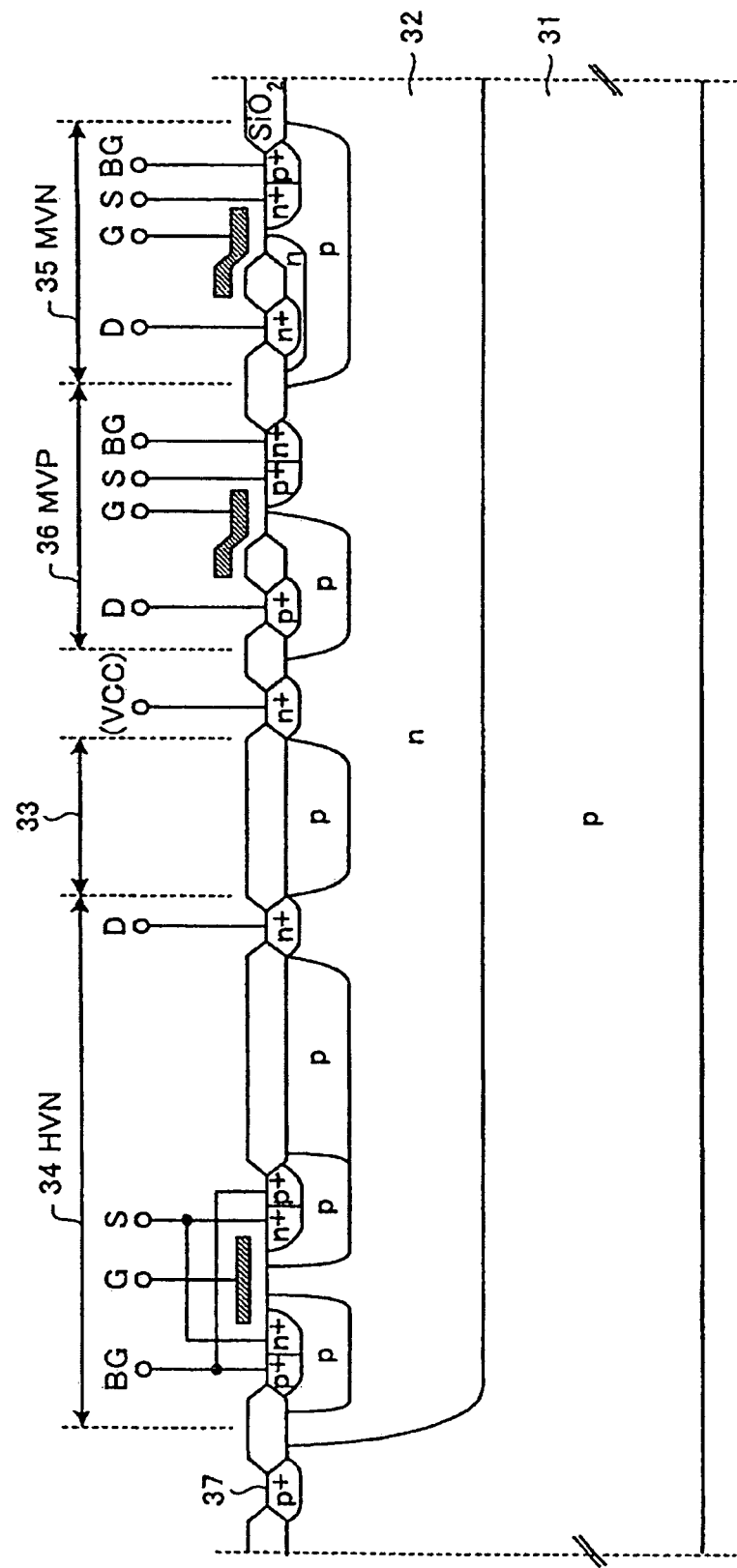
FIG. 7 is a cross sectional view showing an example of a high side device structure.

Here, in each of the high side and low side n-isolation-diffused regions 42 and 43, a circuit such as a CMOS circuit, necessary for forming the high voltage level shifter shown in FIG. 6, for example, is formed with a lateral semiconductor element arranged as shown in FIG. 7, for example. In FIG. 1, however, illustrations of the lateral semiconductor elements are omitted in order to avoid making the figure overly complicated.

Next, an explanation will be made about the operation of the semiconductor device with the arrangement shown in FIG. 1. Like in the related devices, at switching of a low side IGBT, as the collector voltage of the low side IGBT violently fluctuates, abrupt variations dV/dt appear in the emitter potential of a high side IGBT. This causes abrupt voltage variations dV/dt to be applied to the high side n-isolation-diffused region 42. This results in a flow of a charging or discharging current of junction capacitance between the high side n-isolation-diffused region 42 and the p-semiconductor substrate 41.

Figure 2:
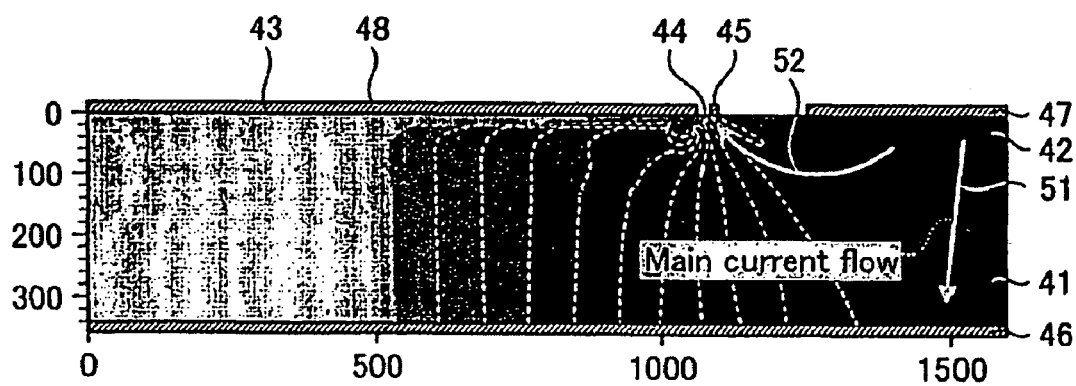
FIG. 2 is a cross sectional view showing a result of a simulation of a state of a current density distribution in the semiconductor device shown in FIG. 1.

A calculated result (a current density) of a state of the distribution of the charging or discharging current by means of a device simulation is shown in FIG. 2. In the device simulation, the distance x is taken as 20 μm and 30 kV/μs is applied as dV/dt. As shown by a thick arrow line 51 in FIG. 2, it is known that most of the charging or discharging current flows from the high side n-isolation-diffused region 42 to the back surface of the substrate and flows into the second electrode 46.

Moreover, as shown by a thin arrow line 52 in FIG. 2, an amount of a current flowing from the high side n-isolation-diffused region 42 to the low side n-isolation-diffused region 43 is small, and the current is taken out from the first electrode 45 through the p-region 44. Thus, it is known that an amount of a current flowing round to the underside of the low side n-isolation-diffused region 43 is small. Therefore, a parasitic n-p-n transistor, formed with the high side n-isolation-diffused region 42, the p-semiconductor substrate 41 and the low side n-isolation-diffused region 43, becomes hard to operate. The depth of the low side n-isolation-diffused region 43 is approximately 5 μm, which is too shallow compared with the vertical dimension of the semiconductor device to be shown as a region in the figure. Therefore, in FIG. 2 and in below explained FIG. 4, the low side n-isolation-diffused region 43 is not shown.

Figure 3:
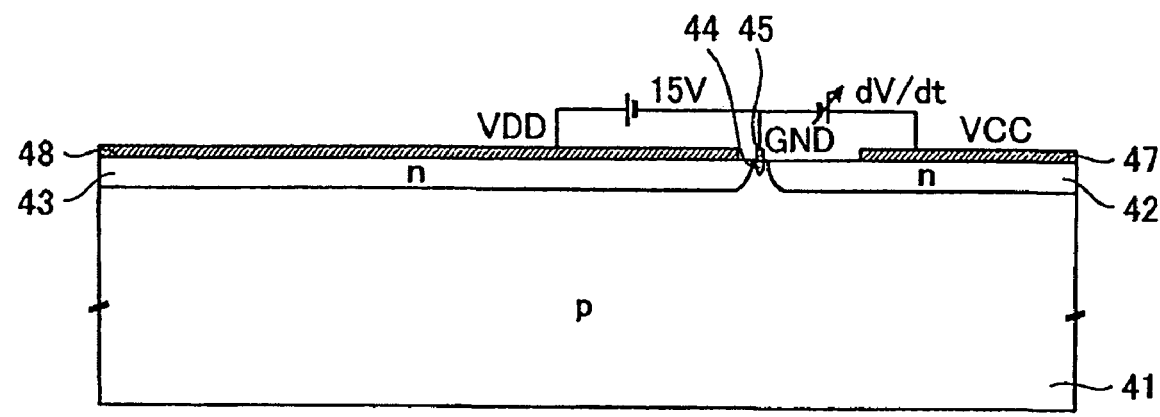
FIG. 3 is a cross sectional view showing an example of a principal part of a semiconductor device without a back surface electrode.
Figure 4:
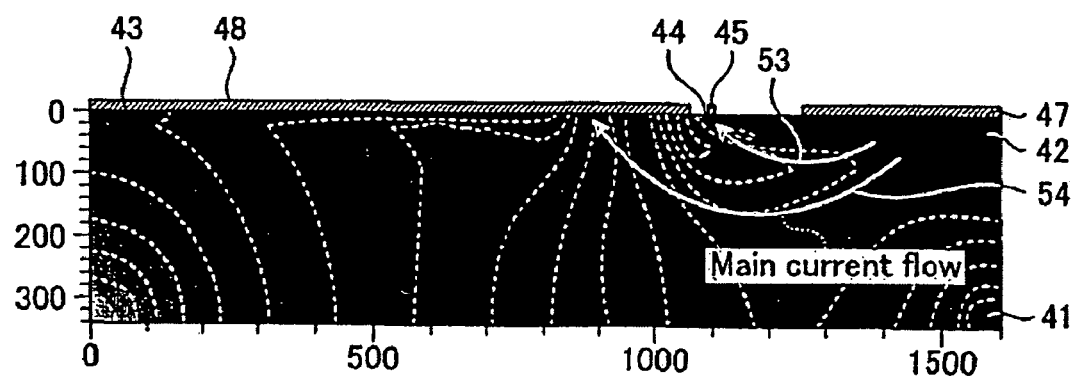
FIG. 4 is a cross sectional view showing a result of a simulation of a state of a current density distribution in the semiconductor device shown in FIG. 3.
Figure 5:
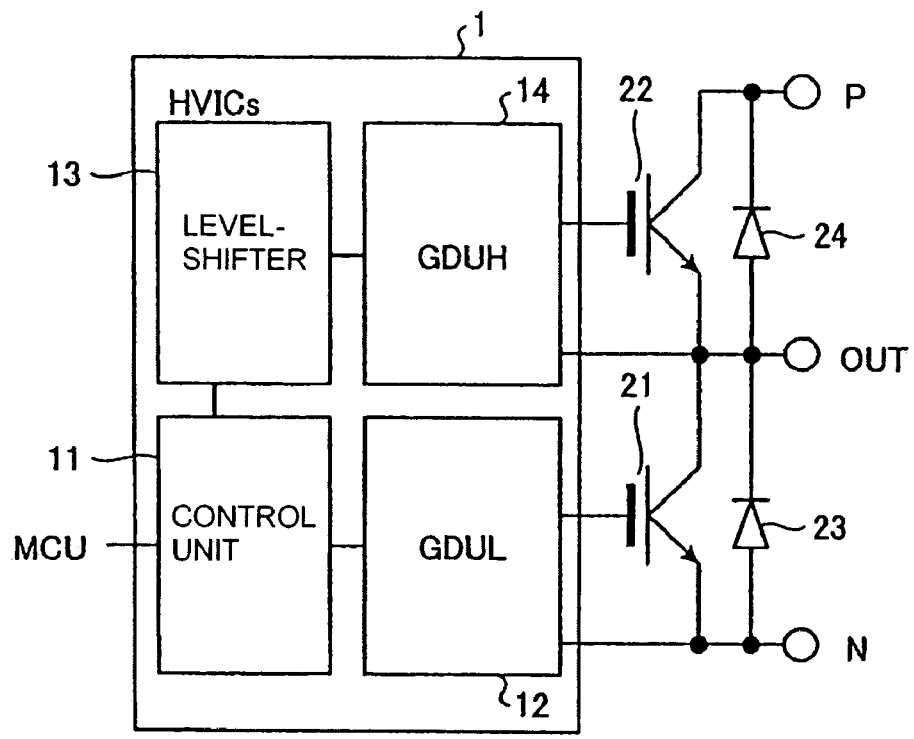
FIG. 5 is a diagram showing connection of an HVIC and IGBTs.

For comparison, as shown in FIG. 3, a similar simulation was carried out about an arrangement in which no electrode is provided on the back surface of the p-semiconductor substrate 41. The conditions for the simulation are the same as those explained above except that no second electrode 46 is provided on the back surface of the p-semiconductor substrate 41. The result of the simulation (current density) is shown in FIG. 4. The absence of the electrode on the back surface of the substrate causes a charging or discharging current to flow from the high side n-isolation-diffused region 42 toward the low side n-isolation-diffused region 43.

It is known that a part of the current, as shown by a thin arrow line 53, is taken out from the first electrode 45 through the p-region 44, but most of the current, as shown by a thick arrow line 54, flows round to the underside of the low side n-isolation-diffused region 43 to reach the low side n-isolation-diffused region 43. This causes the parasitic n-p-n transistor to operate in which the high side n-isolation-diffused region 42, the p-semiconductor substrate 41 and the low side n-isolation-diffused region 43 are made as a collector, a base and an emitter, respectively.

The operation of the parasitic n-p-n transistor largely depends on the distance x, i.e. the dimension of the p-semiconductor substrate 41 between the high side n-isolation-diffused region 42 and the low side n-isolation-diffused region 43. A sufficiently large distance x causes no electrons to reach the high side n-isolation-diffused region 42 even when the electrons are injected from the low side n-isolation-diffused region 43 to the p-semiconductor substrate 41. This inhibits the parasitic p-n-p transistor from performing a bipolar operation.

A measure of the distance x, with which a bipolar operation of a parasitic n-p-n transistor can be thus inhibited, is the diffusion length L of electrons (minority carriers) in the p-semiconductor substrate, and is generally taken as 100 μm or more. The distance x taken as 100 μm or more, however, increases an area occupied by the region between the high side n-isolation-diffused region 42 and the low side n-isolation-diffused region 43 to increase an area of a chip, which results in the disadvantage of increasing the cost of an HVIC.

According to the embodiment, the distance x is shorter than the diffusion length of electrons as minority carriers in the p-semiconductor substrate 41. This makes it unnecessary to increase the chip area, so that an increase in chip cost due to an increased chip area can be avoided. Moreover, since the p-region 44 for taking out a current from the top surface of the substrate has no trench structure, complicated process steps for forming the trench structure are unnecessary, by which an increase in chip cost due to an increase in the number of the process steps can be avoided. Furthermore, as explained above, most of a charging or discharging current is taken out from the second electrode 46 on the back surface of the substrate. This makes it possible to avoid a bipolar operation of a parasitic p-n-p transistor. Therefore, a semiconductor device can be obtained which is robust against faulty operation and device destruction.

In the foregoing, the invention is not limited to the above-explained embodiment but can be variously modified. For example, the dimensions described in the embodiment are mere examples and the invention is not limited to the values. Moreover, in the embodiment, the first conductivity type was taken as a p-type and the second conductivity type was taken as an n-type. The invention, however, is similarly valid even when the first conductivity type is taken as the n-type and the second conductivity type is taken as the p-type.

As was explained in the foregoing, the semiconductor device according to the invention are useful for a semiconductor device such as an HVIC. In particular, the device is suited for a power converter such as an inverter using power switching devices.

What is claimed is:

1. A semiconductor device comprising:
   a semiconductor substrate of a first conductivity type;
   a first region of a second conductivity type selectively provided in a surface layer on a side of a first principal surface of the semiconductor substrate;
   a second region of a second conductivity type provided in the surface layer on the side of the first principal surface of the semiconductor substrate apart from the first region;
   a third region of the first conductivity type provided between the first region and the second region in the surface layer on the side of the first principal surface of the semiconductor substrate, the third region having an impurity concentration higher than the semiconductor substrate;
   a first electrode in contact with the third region;
   a second electrode in contact with a second principal surface of the semiconductor substrate and coupled to be at a potential equal to the potential of the first electrode;
   a third electrode in contact with the first region and coupled to a high side power supply; and
   a fourth electrode in contact with the second region and coupled to a low side power supply;
   wherein the distance between the first region and the second region is shorter than the diffusion length of minority carriers in the semiconductor substrate;
   wherein the distance between the first region and the second region is shorter than 100 μm; and
   wherein operation of a parasitic transistor formed between the first region the second region and the third region is inhibited.

2. The semiconductor device as claimed in claim 1 wherein a circuit is formed with a lateral semiconductor element in each of the first region and the second region.

3. The semiconductor device as claimed in claim 1 wherein the first electrode and second electrode are coupled to ground potential.

\* \* \* \* \*